(12) United States Patent
Forest et al.

(10) Patent No.: US 7,342,955 B2
(45) Date of Patent: Mar. 11, 2008

(54) APPARATUS AND METHOD FOR MOBILE COMMUNICATION DEVICE TRANSMISSION

(75) Inventors: Francis Forest, Lake Villa, IL (US); Armin Klomsdorf, Libertyville, IL (US); Ernest Schirmann, Lake Zurich, IL (US); Robert S. Trocke, Racine, WI (US)

(73) Assignee: Motorola Inc, Schaumburg, IL (US)

( * ) Notice: Subject to any disclaimer, the term of this patent is extended or adjusted under 35 U.S.C. 154(b) by 836 days.

(21) Appl. No.: 10/421,113

(22) Filed: Apr. 23, 2003

(65) Prior Publication Data
US 2004/0213335 A1    Oct. 28, 2004

(51) Int. Cl.
*H04B 1/38* (2006.01)
(52) U.S. Cl. .................................................... 375/219
(58) Field of Classification Search .............. 375/219, 375/312, 297, 220, 295, 296, 358; 455/73, 455/114.3, 108, 126, 522; 398/193
See application file for complete search history.

(56) References Cited

U.S. PATENT DOCUMENTS

| 5,056,109 | A | * | 10/1991 | Gilhousen et al. | .......... 370/342 |
|---|---|---|---|---|---|
| 5,426,641 | A | | 6/1995 | Afrashteh et al. | |
| 5,589,796 | A | | 12/1996 | Alberth, Jr. et al. | |
| 5,757,856 | A | * | 5/1998 | Fang | ............................ 375/265 |
| 5,806,003 | A | * | 9/1998 | Jolma et al. | ................. 455/522 |
| 6,049,704 | A | | 4/2000 | Peckham et al. | |
| 6,408,193 | B1 | * | 6/2002 | Katagishi et al. | ............ 455/571 |
| 6,577,608 | B1 | * | 6/2003 | Moon et al. | ................. 370/311 |
| 6,819,937 | B2 | * | 11/2004 | Knuutila et al. | ............. 455/522 |
| 7,120,400 | B2 | * | 10/2006 | Korol | ........................... 455/126 |
| 2003/0026363 | A1 | * | 2/2003 | Stoter et al. | ................. 375/345 |
| 2004/0198257 | A1 | * | 10/2004 | Takano et al. | ............... 455/108 |

* cited by examiner

*Primary Examiner*—Sam K. Ahn
(74) *Attorney, Agent, or Firm*—Gary J. Cunningham

(57) ABSTRACT

An apparatus and method for transmission power amplifier bias control in an enhanced data rate for global system mobile evolution mobile communication device. The apparatus can include a transmitter configured to transmit information on an enhanced data rate for global system mobile evolution network at a first transmitter output power. The transmitter can include a modulator configured to receive an input signal and map information in the input signal to symbols represented by eight phase offsets and a power amplifier configured to provide the first transmitter output power for transmitting the symbols represented by eight phase offsets. The apparatus can also include a controller configured to adjust a first bias condition of the power amplifier to a second bias condition based on a changed parameter of operation related to the data stored in a memory.

23 Claims, 4 Drawing Sheets

APPARATUS AND METHOD FOR MOBILE COMMUNICATION DEVICE TRANSMISSION

BACKGROUND

1. Field

The present disclosure is directed to an apparatus and method for mobile communication device transmission. In particular, the present disclosure is directed to an apparatus and method for transmission power amplifier bias control in an enhanced data rate for global system mobile evolution (EDGE) mobile communication device.

2. Description of Related Art

Presently, a transmitter in a mobile communication device transmits signals using a power amplifier. For example, the mobile communication device can receive a desired transmit output power from a base station. This desired output power can be used to adjust a gain of the power amplifier in the transmitter for transmitting the signals. Unfortunately, the power amplifier can account for a significant percentage of the total battery current consumed by the transmitter and the mobile communication device. A problem also exists in that changing a bias of the power amplifier to adjust the gain of the power amplifier can result in undesired spurious signals.

SUMMARY

The disclosure provides an apparatus and method for transmission power amplifier bias control in an enhanced data rate for global system mobile evolution mobile communication device.

The apparatus can include an antenna, a receiver configured to receive a first time slot assignment and a first power level requirement associated with the first time slot assignment from an enhanced data rate for global system mobile evolution base station, a transmitter configured to transmit information on an enhanced data rate for global system mobile evolution network at a first transmitter output power based on the first power level requirement, a memory including data stored in the memory, the data related to parameters of operation of the enhanced data rate for global system mobile evolution mobile communication device, the parameters of operation including bias conditions and power level requirements, and a controller configured to adjust a first bias condition to a second bias condition based on a changed parameter of operation related to the data stored in the memory. The transmitter can include a modulator configured to receive an input signal and map information in the input signal to symbols represented by eight phase offsets and a power amplifier configured to provide the first transmitter output power for transmitting the symbols represented by eight phase offsets. The power amplifier can also be configured to operate at a first operating point set by a first bias condition based on the first power level requirement.

The method can include receiving a first time slot assignment and a first power level requirement associated with the first time slot assignment from an enhanced data rate for global system mobile evolution base station, determining a power amplifier first bias condition based on the first power level requirement, mapping information to symbols, the symbols represented by eight phase offsets, to obtain mapped information, transmitting the mapped information using the power amplifier operating at a first operating point set by the first bias condition, adjusting the first bias condition of the power amplifier to a second bias condition, and transmitting the mapped information using the power amplifier operating at a second operating point set by the second bias condition.

BRIEF DESCRIPTION OF THE DRAWINGS

The preferred embodiments of the present invention will be described with reference to the following figures, wherein like numerals designate like elements, and wherein.

DETAILED DESCRIPTION OF PREFERRED EMBODIMENTS

Figure 1:
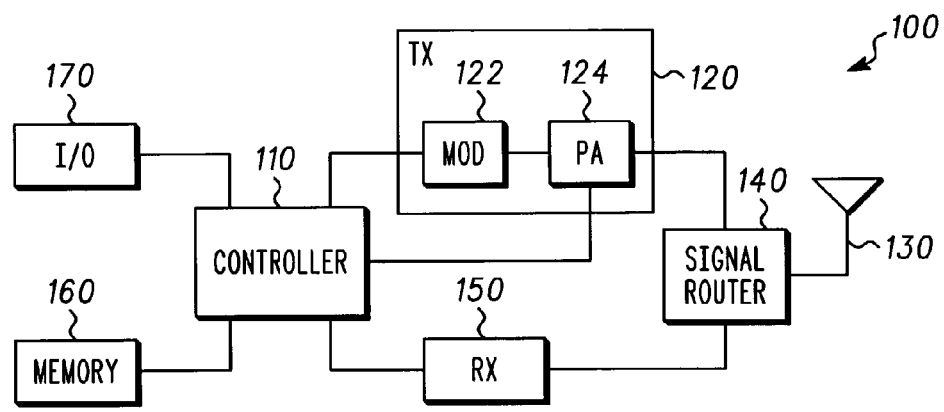
FIG. 1 is an exemplary block diagram of an enhanced data rate for global system mobile evolution mobile communication device according to one embodiment.

FIG. 1 is an exemplary block diagram of an enhanced data rate for global system mobile evolution (EDGE) mobile communication device 100 according to one embodiment. The mobile communication device 100 may be a wireless telephone, a cellular telephone, a personal digital assistant, a computer terminal, a pager, or any other device that is capable of sending and receiving data on an EDGE mobile communication network. The mobile communication device 100 can include a controller 110, a transmitter 120, an antenna 130, a signal router 140, a receiver 150, a memory 160, and input and output circuitry 170. The transmitter 120 can include a modulator 122 and a power amplifier 124. The input and output circuitry 170 can include audio input circuitry such as a microphone or a line input, audio output circuitry such as a speaker or a line output, a display, a keypad, data input and output circuitry, or any other input and output circuitry. The memory 160 can be a transistor based memory, a random access memory, a read only memory, an optical memory, or any other component useful for storing data. The signal router 140 may employ a switch, a diplexer, an antenna diversity system, or any other component useful for filtering or routing a transmit and a receive signal.

In operation, the receiver 150 can receive signals from a base station. The signals can include information that commands the mobile communication device 100 to transmit at a specified power level in a particular interval of time, such as a time slot or a frame. The controller 110 can use this power level information and other variables to define an appropriate bias condition such as a bias level for the power amplifier 124. The other variables can be stored in the memory 160 and can include temperature, battery voltage, signal strength, modulation protocol, frequency band, transmit key state, bias control state, or other variables relevant to power amplifier operation. For example, the memory 160 can include a look up table that cross references the variables with an appropriate bias condition. The memory 160 can also include functions for determining an appropriate bias condition as a function of the power level and/or the other variables. For example, the bias condition can be used to adjust an operating point of the power amplifier 124. The operating point can determine the gain, the linearity, the efficiency, or the like, of the power amplifier 124. The bias condition can adjust the operating point of the power amplifier 124 to reduce the current drain of the power amplifier 124 while maintaining acceptable performance. For example, when the desired transmit power decreases, the power amplifier bias level can also decrease to reduce current drain while still transmitting at a minimum desired transmit power.

The controller 110 can also determine a transmit power target, for example, based on information received from a base station. The transmit power target can be applied to functions stored in the memory 160 to retrieve corresponding settings for power amplifier bias levels and settings for programmable gain and attenuation stages in the transmitter 120. These gain stages may exist in the power amplifier 124, at the modulator 122, or elsewhere in the transmitter 120. The controller 110 can then establish proper control signals for each gain stage and control the gain stages with the control signals.

The controller 110 can send a bias control signal to the power amplifier 124 to adjust the operating point of the power amplifier 124. The mobile communication device 100 can then transmit voice or data information using the power amplifier 124 operating at the adjusted operating point. For example, information can be received via the input and output circuitry 170 or information can be obtained from the memory 160. This information can be modulated using the modulator 122. For example, the modulator 122 can modulate the information to symbols represented by eight phase offsets for eight phase shift keying modulation for EDGE transmission. The modulator 122 can also modulate the information to symbols represented by phase rotation for Gaussian Minimum Shift Keying (GMSK) transmission which can be transmitted on an EDGE network.

According to a related embodiment, the receiver 150 can be coupled to the antenna 130. For example, the receiver 150 can be coupled to the antenna 130 via the signal router 140. The receiver 150 can be configured to receive a first time slot assignment and a first power level requirement associated with the first time slot assignment from an enhanced data rate for global system mobile evolution base station. The transmitter 120 can be coupled to the antenna 130. For example, the transmitter 120 can be coupled to the antenna 130 via the signal router 140. The transmitter 120 can be configured to transmit information on an enhanced data rate for global system mobile evolution network at a first transmitter output power based on the first power level requirement. The modulator 122 can be configured to receive an input signal and map information in the input signal to symbols represented by eight phase offsets. The input signal received by the modulator 122 can be any signal desirable to transmit on a mobile communications network. For example, the signal can be a voice signal or a data signal received from the controller 110 or other element of the mobile communication device 100. The power amplifier 124 can be coupled to the modulator 122 and coupled to the antenna 130. The power amplifier 124 can be configured to provide the first transmitter output power for transmitting the symbols represented by eight phase offsets and also configured to operate at a first operating point set by a first bias condition based on the first power level requirement. The memory 160 can include data stored in the memory 160. The data can be related to parameters of operation of the mobile communication device 100. For example, the parameters of operation can include bias conditions, power level requirements, temperatures, battery strength indicators, and any other parameters of operation of a mobile communication device that can affect the operation of the power amplifier 124 in the mobile communication device 100. These parameters of operation can be cross-referenced in the memory 160 to provide a desired bias condition for an optimal operating point of the power amplifier 124. For example, the parameters of operation may be in a look-up table, may be incorporated into equations or functions, or may be cross-referenced in any other way useful for determining an optimal operating point for the power amplifier 124 based on selected parameters of operation. For example, the parameters of operation can be related to determine a bias condition that reduces the current drain of the power amplifier 124 while maintaining power requirements provided by a base station. The controller 110 can be coupled to at least the power amplifier 124, the memory 160, the transmitter 120, and the receiver 150. The controller 110 can be configured to adjust the first bias condition to a second bias condition based on a changed parameter of operation related to the data stored in the memory 160.

The receiver 150 can be further configured to receive, from an enhanced data rate for global system mobile evolution base station, a second time slot assignment and a second power level requirement associated with the second time slot assignment. The controller 110 can be further configured to adjust the first bias condition to the second bias condition based on the second power level requirement and based on the data stored in the memory 160. The controller 100 can also be configured to adjust the first bias condition to the second bias condition during a transition period between periods of transmitting the mapped information. The transition period can be a period between the first time slot and the second time slot. The transition period can also be a period between a first frame and a second frame. The controller 110 can be additionally configured to adjust the first bias condition to the second bias condition by ramping the first bias condition to the second bias condition. Ramping can include incrementally adjusting the bias condition in steps between the first bias condition and the second bias condition. The controller 110 can also be configured to reduce the bias condition from the first bias condition to the second bias condition based on the second power level requirement being less than the first power level requirement. The modulator 122 can be further configured to map information in the input signal to symbols represented by phase rotation. The signal router 140 can be coupled between the antenna 130 and the power amplifier 124 and coupled between the antenna 130 and the receiver 150. The signal router 140 can be configured to route a transmit signal from the transmitter 120 and route a receive signal to the receiver 150. The transmitter 120 can additionally be configured to transmit information on the enhanced data rate for global system mobile evolution network during the first timeslot at a first transmitter output power based on the first power level requirement.

Figure 2:
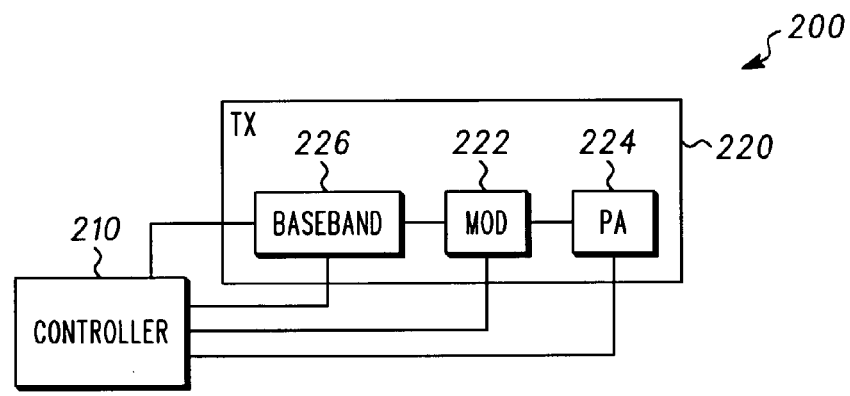
FIG. 2 is an exemplary block diagram of an enhanced data rate for global system mobile evolution mobile communication device according to another embodiment.

FIG. 2 is an exemplary block diagram of an enhanced data rate for global system mobile evolution (EDGE) mobile communication device 200 according to another embodiment. The mobile communication device 200 operates in a similar manner with similar connections as the mobile communication device 100, but selected elements are not illustrated for simplicity. The mobile communication device 200 can include a controller 210 and a transmitter 220. The transmitter 220 can include a modulator 222, a power amplifier 224, and a baseband unit 226. The power amplifier 224 may consist of one, two, or more gain stages each of which may be controlled by a bias control signal from the controller 210.

In operation, the baseband unit 226 can receive a signal to be transmitted from the controller 210 or other signal source. The baseband unit 226 can convert the information signal from a digital form to an analog form. An analog filter (not shown) may be used after the baseband unit 226 for reducing spurious noise produced by the digital to analog conversion. The modulator 222 can modulate the resulting analog signal onto a radio frequency (RF) carrier frequency, which can be in-turn gained up or attenuated. For example, the modulator 222 can modulate the information to symbols represented by eight phase offsets for eight phase shift keying modulation for EDGE transmission. The modulator 122 can also modulate the information to symbols represented by phase rotation for GMSK transmission, which can be transmitted on an EDGE network.

The controller 210 can control the signal level sent from the modulator 222 to the power amplifier 224. For example the controller can adjust a variable gain stage of the modulator 222 to variably control the signal level into the power amplifier 224. The controller 210 can also control the signal level sent into the power amplifier 224 by digitally scaling the signal in the baseband unit 226. The power amplifier 224 can amplify the modulated RF signal to its final desired transmit power level.

Figure 3:
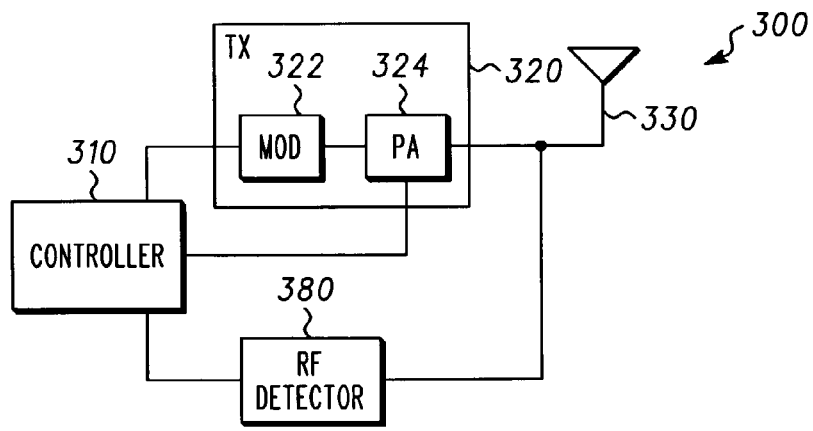
FIG. 3 is an exemplary block diagram of an enhanced data rate for global system mobile evolution mobile communication device according to another embodiment.

FIG. 3 is an exemplary block diagram of an enhanced data rate for global system mobile evolution (EDGE) mobile communication device 300 according to another embodiment. The mobile communication device 300 operates in a similar manner with similar connections as the mobile communication devices 100 and 200, but selected elements are not illustrated for simplicity. The mobile communication device 300 can include a controller 310, a transmitter 320, an antenna 330, and an RF detector 380. The transmitter 320 can include a modulator 322 and a power amplifier 324.

In operation, the RF detector 380 can generate a signal proportionate to an actual transmit power of the mobile communication device 300. For example, this signal may be based on RF energy sampled at an output of the power amplifier 324. The RF detector 380 can convert the sampled RF energy to a DC signal that is monitored by the controller 310 and used for automatic output control. For example, the controller 310 can use the DC signal to determine the actual output power of the mobile communication device 300 and can use it to correct the actual output power to more closely approximate a desired output power.

Figure 4:
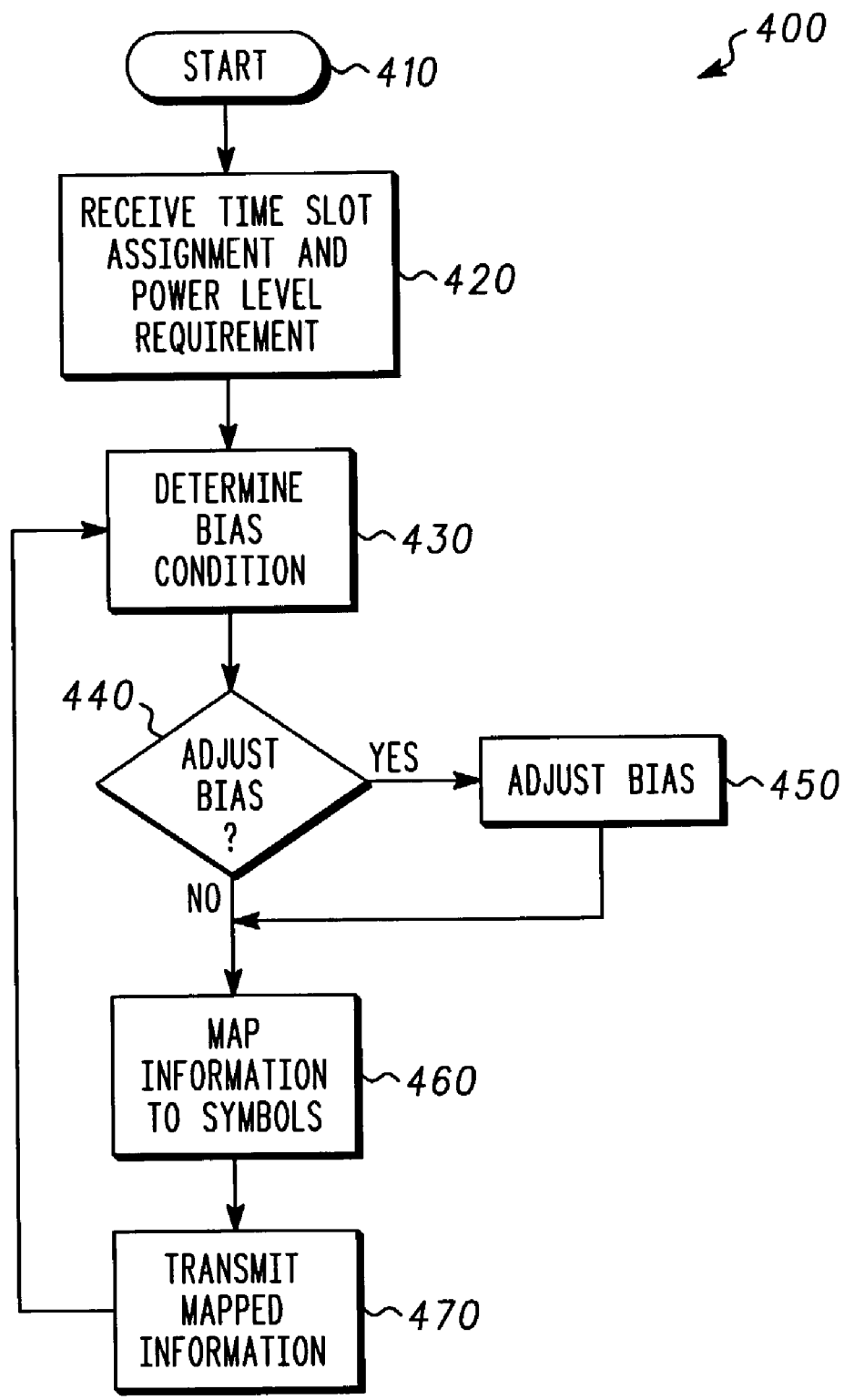
FIG. 4 is an exemplary flowchart outlining the operation of a mobile communication device according to a preferred embodiment.

FIG. 4 is an exemplary flowchart 400 outlining the operation of the mobile communication device 100 according to a preferred embodiment. In step 410, the flowchart begins. In step 420, the controller 110 receives a time slot assignment and a power level requirement associated with the time slot assignment from an enhanced data rate for global system mobile evolution base station. In step 430, the controller 110 determines a desired power amplifier bias condition. For example, the controller 110 can use power level information and other variables to define an appropriate bias level for the power amplifier 124. As mentioned, related variables can be stored in the memory 160 and can include temperature, battery voltage, signal strength or other variables relevant to power amplifier operation. In step 440, the controller 110 determines if a current bias condition of the power amplifier 124 should be adjusted based on a desired bias condition determined in step 430. If the current bias condition should be adjusted, in step 450, the controller 110 adjusts the bias condition of the power amplifier 124. In step 460, the modulator 122 maps information to be transmitted to symbols. For example, the modulator 122 can modulate the information to symbols represented by eight phase offsets for eight phase shift-keying modulation for EDGE transmission. The modulator 122 can also modulate the information to symbols represented by phase rotation for GMSK transmission, which can be transmitted on an EDGE network. In step 470, the mobile communication device 100 transmits the mapped information using the power amplifier 124 operating at an operating point set by the bias condition.

The process of adjusting the bias can then be repeated starting at step 430. For example, a new power level may be received that requires bias condition adjustment. Also, other conditions may change that require bias condition adjustment. For example, the controller 110 may adjust the bias condition based on a changed operating temperature, a changed battery voltage supply, a changed modulation format, or other conditions that can affect a desired operating point of the power amplifier 124. For example, a new time slot assignment and a new power level requirement associated with the new time slot assignment can be received from an enhanced data rate for global system mobile evolution base station. The controller 110 can determine a new power amplifier bias condition based on the new power level requirement and can adjust the bias condition to a new bias condition according to the new power level requirement. The transmitter 120 can then transmit the mapped information using the power amplifier 124 operating at the new operating point set by the new bias condition. The information can be transmitted in a relevant time slot assigned by the base station.

The bias condition can be adjusted between adjacent or subsequent time slots. Furthermore, the transmit power level of the power amplifier 124 can be reduced to adjust the bias condition of the power amplifier 124. Additionally, the bias condition can be reduced from a first bias condition to a second bias condition or raised from the first bias condition to the second bias condition depending on transmit power requirements and depending on other data stored in the memory 160.

The controller 110 can adjust the bias condition of the power amplifier 124 by ramping the bias condition from the first bias condition to the second bias condition without reducing the power of the power amplifier 124. This ramping may or may not be done during a transition period between periods of transmitting the mapped information. The controller 110 can ramp the first bias condition to the second bias condition by incrementally adjusting the bias condition in steps between the first bias condition and the second bias condition. Again, the controller 110 can reduce the power of the power amplifier 124 in between time slots to adjust the first bias condition of the power amplifier 124 to the second bias condition. The controller 110 can determine the power amplifier first bias condition based on the power level requirement and based on data stored in the memory 160 of the mobile communication device 100. The data can be related to parameters of operation of the enhanced data rate for global system mobile evolution mobile communication device 100. The parameters of operation can include bias conditions and the power level requirements.

Figure 5:
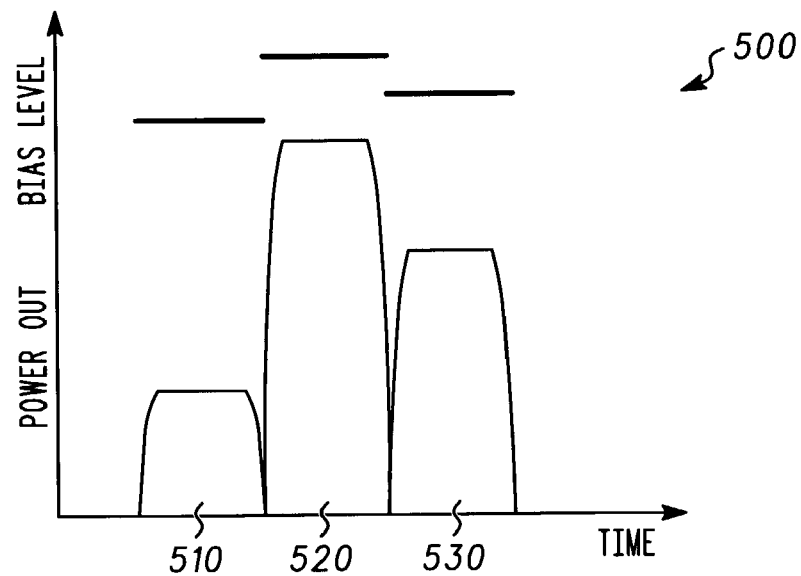
FIG. 5 is an exemplary graph of relative power outputs and bias levels of a mobile communication device with respect to time according to one embodiment.

FIG. 5 is an exemplary graph 500 of relative power outputs and bias levels of the mobile communication device 100 with respect to time. Graph 500 illustrates how the controller 110 can change the bias condition such as the bias level of the power amplifier 124 abruptly between transmission bursts or slots 510, 520, and 530. Each bias condition or level can be optimized for each transmission burst according to the techniques discussed above. The power of the power amplifier 124 can be reduced to a low transmit power state during a transition period between transmission bursts 510, 520, and 530 to change the bias condition. This reduction can be used to meet spectral emissions requirements such as reduced spectral emissions. For example, the power output of the power amplifier 124 can be reduced below a threshold level or can be turned off to meet spectral emissions requirements when adjusting the bias condition of the power amplifier 124. The transmit bursts 510, 520, and 530 can be GMSK transmit bursts or EDGE transmit bursts. For example and EDGE transmit burst can include packets representing voice and/or data information. Also, the transmit bursts 510, 520, and 530 may be substantially adjacent to each other or may have larger gaps between them. For example, each transmit burst 510, 520, and 530 may occur in a time slot assigned by a base station and at an appropriate power level. Whole time slots or whole frames may exist between the transmit bursts where power amplifier 124 can be turned off when not transmitting data. An exemplary frame can consist of three, eight, or any other number of time slots.

Figure 6:
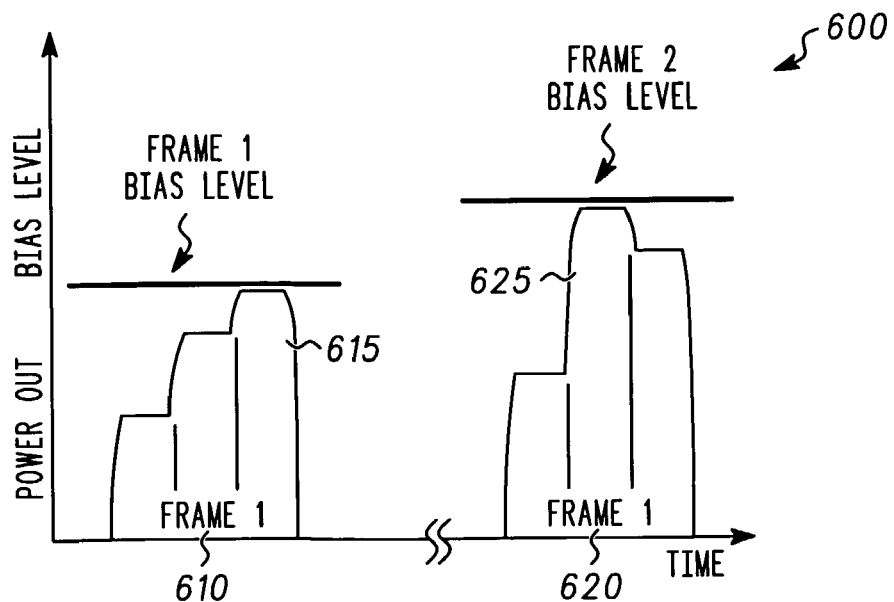
FIG. 6 is another exemplary graph of relative power outputs and bias levels of a mobile communication device with respect to time according to another embodiment.

FIG. 6 is another exemplary graph 600 of relative power outputs and bias levels of the mobile communication device 100 with respect to time. Graph 600 illustrates how the controller 110 can change the bias condition of the power amplifier 124 for different transmit frames 610 and 620. Each bias condition or level can be optimized for each frame according to the techniques discussed above. Also, the bias condition can be optimized for the slots 615 and 625 in each respective frame 610 and 620 requiring the maximum bias level. For example, the bias condition can be set for the slot 625 in the frame 620 requiring the maximum power output of the power amplifier 124 and can be maintained for the rest of the frame 620 until the power output of the power amplifier 124 can be reduced enough to avoid adverse effects when changing the bias level. Thus, a single bias can be maintained for some adjacent slots when power is maintained at the slot boundaries and can be changed for other slots at frame boundaries or other low transmitter power situations. The gap between the frames 610 and 620 can be a transition period of less than a slot width, a slot width, a frame width, or any other time where transmit power can be reduced to a level that meets performance requirements.

Figure 7:
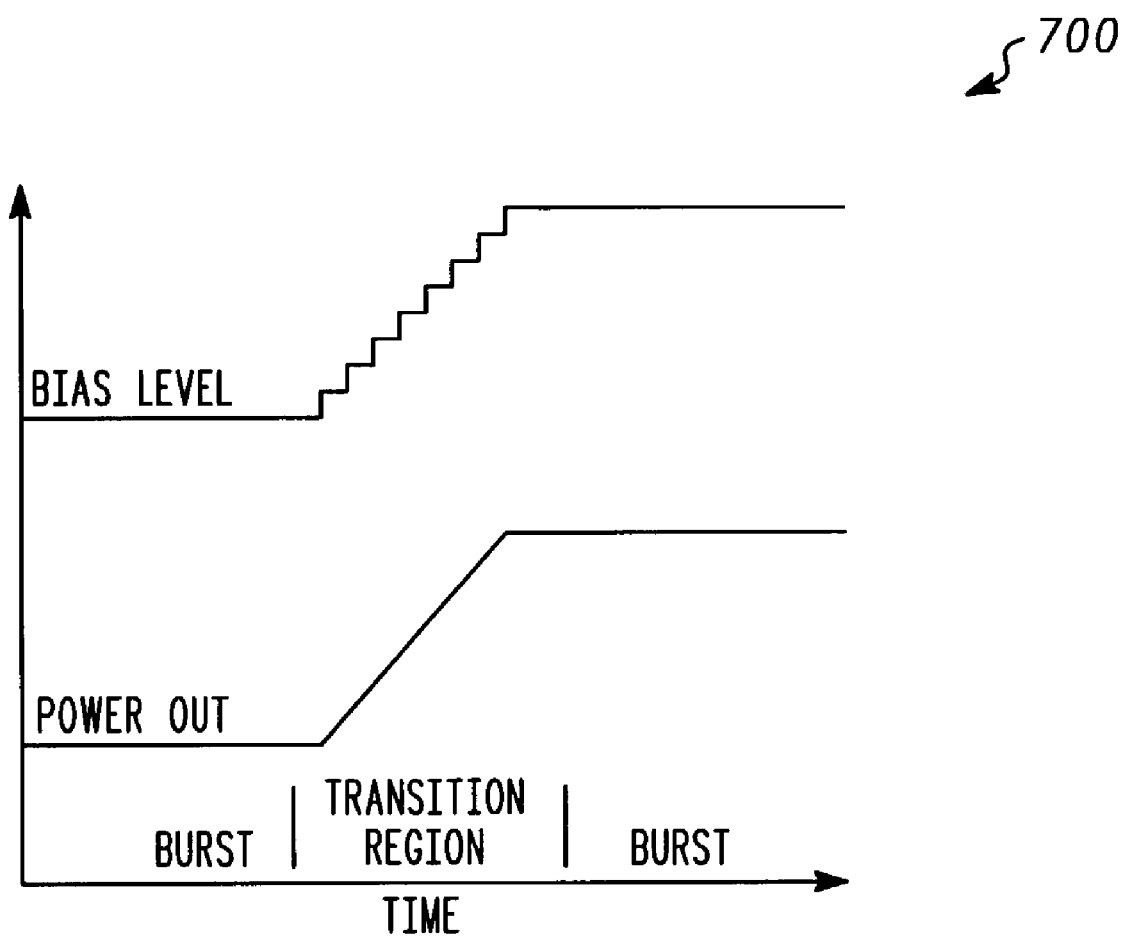
FIG. 7 is another exemplary graph of relative power output and bias level of a mobile communication device with respect to time according to another embodiment.

FIG. 7 is another exemplary graph 700 of relative power output and bias level of the mobile communication device 100 with respect to time. Graph 700 illustrates how the bias level or condition can be stepped or ramped between bias conditions. The bias level can be ramped up or down between bias conditions during a transition region. This transition region may be a transition period gap between transmissions where the power amplifier 124 output power is reduced. Also, this transition region may exist at a boundary between adjacent slots such as those illustrated in FIG. 6 with the transmission region overlapping the transmission slots. Thus, ramping may be used to change the bias condition with reduced spectral emissions when the power amplifier 124 output power cannot be reduced.

Accordingly, a bias condition of the power amplifier 124 can be abruptly changed when the output power of the power amplifier 124 is reduced or when the power amplifier 124 is turned off without causing adverse spectral emissions. Also, when the bias condition is ramped between different bias conditions, the output power of the power amplifier 124 does not need to be reduced to avoid adverse spectral emissions.

Thus, among other benefits the present disclosure can reduce the amount of battery current consumed by the power amplifier 124 in the transmitter 120 of the mobile communication device 100. The present disclosure can also allow for changing a bias of the power amplifier 124 to adjust the gain of the power amplifier 124 without generating excessive undesired spurious signals.

The method of this invention is preferably implemented on a programmed processor. However, various components of the mobile communication device 100 may also be implemented on a general purpose or special purpose computer, a programmed microprocessor or microcontroller and peripheral integrated circuit elements, an ASIC or other integrated circuit, a hardware electronic or logic circuit such as a discrete element circuit, a programmable logic device such as a PLD, PLA, FPGA or PAL, or the like. In general, any device on which resides a finite state machine capable of implementing the flowcharts shown in the Figures may be used to implement the processor functions of this invention.

While this invention has been described with specific embodiments thereof, it is evident that many alternatives, modifications, and variations will be apparent to those skilled in the art. For example, various components of the embodiments may be interchanged, added, or substituted in the other embodiments. Accordingly, the preferred embodiments of the invention as set forth herein are intended to be illustrative, not limiting. Various changes may be made without departing from the spirit and scope of the invention.

What is claimed is:

1. An enhanced data rate for global system mobile evolution mobile communication device comprising:
   an antenna;
   a receiver coupled to the antenna, the receiver configured to receive, from an enhanced data rate for global system mobile evolution base station, a first time slot assignment and a first power level requirement associated with the first time slot assignment;
   a transmitter coupled to the antenna, the transmitter configured to transmit information on an enhanced data rate for global system mobile evolution network at a first transmitter output power based on the first power level requirement, the transmitter including:
      a modulator configured to receive an input signal and map information in the input signal to symbols represented by eight phase offsets; and
      a power amplifier coupled to the modulator and coupled to the antenna, the power amplifier providing the first transmitter output power for transmitting the symbols represented by eight phase offsets, the power amplifier operating at a first operating point set by a first bias condition based on the first power level requirement;
   a memory including data stored in the memory, the data related to parameters of operation of the enhanced data rate for global system mobile evolution mobile communication device, the parameters of operation including bias conditions and power level requirements; and
   a controller coupled to the power amplifier and coupled to the memory, the controller configured to adjust the first bias condition to a second bias condition based on a changed parameter of operation related to the data stored in the memory.

2. The enhanced data rate for global system mobile evolution mobile communication device according to claim 1,
   wherein the receiver is further configured to receive, from an enhanced data rate for global system mobile evolution base station, a second time slot assignment and a second power level requirement associated with the second time slot assignment, and
   wherein the controller is further configured to adjust the first bias condition to the second bias condition based on the second power level requirement and based on the data stored in the memory.

3. The enhanced data rate for global system mobile evolution mobile communication device according to claim 2, wherein the controller is further configured to adjust the first bias condition to the second bias condition during a transition period between periods of transmitting the mapped information.

4. The enhanced data rate for global system mobile evolution mobile communication device according to claim 3, wherein the transition period is a period between the first time slot and the second time slot.

5. The enhanced data rate for global system mobile evolution mobile communication device according to claim 3, wherein the transition period is a period between a first frame and a second frame.

6. The enhanced data rate for global system mobile evolution mobile communication device according to claim 2, wherein the controller is further configured to adjust the first bias condition to the second bias condition by ramping the first bias condition to the second bias condition.

7. The enhanced data rate for global system mobile evolution mobile communication device according to claim 6, wherein ramping comprises incrementally adjusting the bias condition in steps between the first bias condition and the second bias condition.

8. The enhanced data rate for global system mobile evolution mobile communication device according to claim 2, wherein the controller is further configured to reduce the bias condition from the first bias condition to the second bias condition based on the second power level requirement being less than the first power level requirement.

9. The enhanced data rate for global system mobile evolution mobile communication device according to claim 1, wherein the modulator is further configured to map information in the input signal to symbols represented by phase rotation.

10. The enhanced data rate for global system mobile evolution mobile communication device according to claim 1, further comprising a signal router coupled between the antenna and the power amplifier and coupled between the antenna and the receiver, the signal router configured to route a transmit signal and configured to route a receive signal.

11. The enhanced data rate for global system mobile evolution mobile communication device according to claim 1, wherein the data related to parameters of operation is based on bias conditions chosen to reduce a current drain of the power amplifier while maintaining power level and spectral emission requirements received from the enhanced data rate for global system mobile evolution base station.

12. The enhanced data rate for global system mobile evolution mobile communication device according to claim 1, wherein the transmitter is further configured to transmit information on the enhanced data rate for global system mobile evolution network during the first timeslot at a first transmitter output power based on the first power level requirement.

13. A method of operating a power amplifier in an enhanced data rate for global system mobile evolution mobile communication device comprising:
   receiving a first time slot assignment and a first power level requirement associated with the first time slot assignment from an enhanced data rate for global system mobile evolution base station;
   determining a power amplifier first bias condition based on the first power level requirement;
   mapping information to symbols, the symbols represented by eight phase offsets, to obtain mapped information;
   transmitting the mapped information using the power amplifier operating at a first operating point set by the first bias condition;
   adjusting the first bias condition of the power amplifier to a second bias condition; and
   transmitting the mapped information using the power amplifier operating at a second operating point set by the second bias condition.

14. The method according to claim 13,
   wherein transmitting the mapped information using the power amplifier operating at the first operating point set by the first bias condition includes transmitting the mapped information in a first time slot assigned by the first time slot assignment; and
   wherein transmitting information using the power amplifier operating at the second operating point set by the second bias condition includes transmitting the mapped information in a second time slot.

15. The method according to claim 14, wherein the first time slot is adjacent to the second time slot.

16. The method according to claim 13, wherein adjusting further comprises reducing a transmit power level of the power amplifier to adjust the first bias condition of the power amplifier to a second bias condition.

17. The method according to claim 13, wherein adjusting further comprises ramping the bias condition from the first bias condition to the second bias condition.

18. The method according to claim 17, wherein ramping comprises incrementally adjusting the bias condition in steps between the first bias condition and the second bias condition.

19. The method according to claim 13, wherein adjusting further comprises reducing the power of the power amplifier in between time slots to adjust the first bias condition of the power amplifier to a second bias condition.

20. The method according to claim 13, wherein determining further comprises determining the power amplifier first bias condition based on the power level requirement and based on data stored in a memory of the mobile communication device, the data related to parameters of operation of the enhanced data rate for global system mobile evolution mobile communication device, the parameters of operation including bias conditions and the power level requirements.

21. The method according to claim 13, further comprising:
   receiving a second time slot assignment and a second power level requirement associated with the second time slot assignment from an enhanced data rate for global system mobile evolution base station; and
   determining whether the second power level requirement is less than the first power level requirement, wherein adjusting the first bias condition of the power amplifier to a second bias condition reduces a bias condition based on the second power level requirement being less than the first power level requirement.

22. The method according to claim 13, further comprising mapping the information to symbols represented by phase rotation.

23. An enhanced data rate for global system mobile evolution mobile communication device comprising:
   an antenna;
   a signal router coupled to the antenna, the signal router configured to route a transmit signal and route a receive signal;
   a receiver coupled to the signal router, the receiver configured to receive, from an enhanced data rate for global system mobile evolution base station, a first time slot assignment, a first power level requirement associated with the first time slot assignment, a second time slot assignment, and a second power level requirement associated with the second time slot assignment;
   a transmitter coupled to the signal router, the transmitter configured to transmit information on an enhanced data rate for global system mobile evolution network, the transmitter including:
      a modulator configured to receive an input signal, map information in the input signal to symbols represented by phase rotation during the first time slot assignment, and map information to symbols represented by eight phase offsets during the second time slot assignment; and
      a power amplifier coupled to the modulator and coupled to the signal router, the power amplifier configured to transmit the symbols represented by phase rotation during the first time slot assignment at a first operating point set by a first bias condition based on the first power level requirement and transmit the symbols represented by eight phase offsets during the second time slot assignment at a second operating point set by a second bias condition based on the second power level requirement;
   a memory including data stored in the memory, the data related to parameters of operation of the enhanced data rate for global system mobile evolution mobile communication device, the parameters of operation including bias conditions and power level requirements; and
   a controller coupled to the power amplifier, the controller configured to adjust the first bias condition to the second bias condition, during a transition period in information transmission, based on a changed parameter of operation related to the data stored in the memory.

* * * * *